United States Patent
Bettinelli

(10) Patent No.: US 10,134,924 B2
(45) Date of Patent: Nov. 20, 2018

(54) SCREEN-PRINTING SYSTEM FOR A PHOTOVOLTAIC CELL, AND RELATED METHODS

(75) Inventor: Armand Bettinelli, Coublevie (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 1154 days.

(21) Appl. No.: 14/130,549

(22) PCT Filed: Jun. 26, 2012

(86) PCT No.: PCT/EP2012/062339
§ 371 (c)(1),
(2), (4) Date: Feb. 13, 2014

(87) PCT Pub. No.: WO2013/004550
PCT Pub. Date: Jan. 10, 2013

(65) Prior Publication Data
US 2014/0147963 A1    May 29, 2014

(30) Foreign Application Priority Data

Jul. 1, 2011   (FR) ..................... 11 55923

(51) Int. Cl.
*B41F 15/44*   (2006.01)
*H01L 31/0224*   (2006.01)
(Continued)

(52) U.S. Cl.
CPC .. *H01L 31/022425* (2013.01); *B41F 15/0881* (2013.01); *B41F 15/36* (2013.01);
(Continued)

(58) Field of Classification Search
CPC .. B41F 15/36; B41F 15/0813; B41F 15/0881; B41F 15/44; B41N 1/24; B41P 2215/50;
(Continued)

(56) References Cited

U.S. PATENT DOCUMENTS 1,737,243 A * 11/1929 Houston .............. B07B 1/4609
                                                    428/124
5,606,911 A     3/1997 Cane
(Continued)

FOREIGN PATENT DOCUMENTS

DE     1 068 277       11/1959
DE     3045241    *    7/1982 ............. B41F 15/36
(Continued)

OTHER PUBLICATIONS

Notice of Reasons for Rejection issued by Japanese Patent Office for corresponding Japanese application 2014-517653 dated Feb. 16, 2016 with English translation.

*Primary Examiner* — Blake A Tankersley
*Assistant Examiner* — Marissa Ferguson Samreth
(74) *Attorney, Agent, or Firm* — Haug Partners LLP

(57) ABSTRACT

Screen-printing system comprising a metal stencil (12), and a cloth (15) fixed to the entire periphery of said metal stencil (12) to form a trampoline assembly, characterized in that the cloth (15) fixed to the metal stencil (12) has at least one free end, in order to decrease or prevent deformation under the effect of a doctor blade (20).

15 Claims, 4 Drawing Sheets

(51) Int. Cl.
  *B41F 15/36* (2006.01)
  *H05K 3/12* (2006.01)
  *B41F 15/08* (2006.01)
  *H01L 31/18* (2006.01)
  *B41N 1/24* (2006.01)

(52) U.S. Cl.
  CPC .............. *B41F 15/44* (2013.01); *H01L 31/18* (2013.01); *H05K 3/1225* (2013.01); *B41N 1/248* (2013.01); *B41P 2215/50* (2013.01); *Y02E 10/50* (2013.01)

(58) Field of Classification Search
  CPC .......... H05K 3/1225; H01L 31/022425; H01L 31/18; Y10T 29/49826; Y02E 10/50
  See application file for complete search history.

(56) References Cited

U.S. PATENT DOCUMENTS

| | | | |
|---|---|---|---|
| 6,258,445 B1 * | 7/2001 | Schilling | B41F 15/36 |
| | | | 428/193 |
| 7,513,194 B2 * | 4/2009 | Yanagihara | B41N 1/247 |
| | | | 101/127.1 |
| 2008/0098911 A1 | 5/2008 | Yanagihara et al. | |
| 2008/0289519 A1 * | 11/2008 | Newman, Jr. | B41N 1/241 |
| | | | 101/127.1 |
| 2010/0252102 A1 * | 10/2010 | Bettinelli | B41F 15/0881 |
| | | | 136/256 |

FOREIGN PATENT DOCUMENTS

| | | | | |
|---|---|---|---|---|
| DE | 3205541 | * | 8/1983 | .............. B41F 15/36 |
| DE | 196 15 058 A | | 10/1997 | |
| DE | 20 2006 006712 U | | 7/2006 | |
| EP | 1 705 029 A | | 9/2006 | |
| GB | 2264460 | * | 8/1993 | .............. B41F 15/36 |
| JP | 2002-134894 A | | 5/2002 | |
| JP | 2008-110533 A | | 5/2008 | |
| JP | 2010-179483 A | | 8/2010 | |
| WO | 94/07697 | * | 4/1994 | .............. B41F 15/36 |
| WO | 2009059584 | * | 3/2009 | .............. B41F 15/36 |
| WO | 2012130508 | * | 10/2012 | .............. B41F 15/34 |

* cited by examiner

--Prior Art--

--Prior Art--

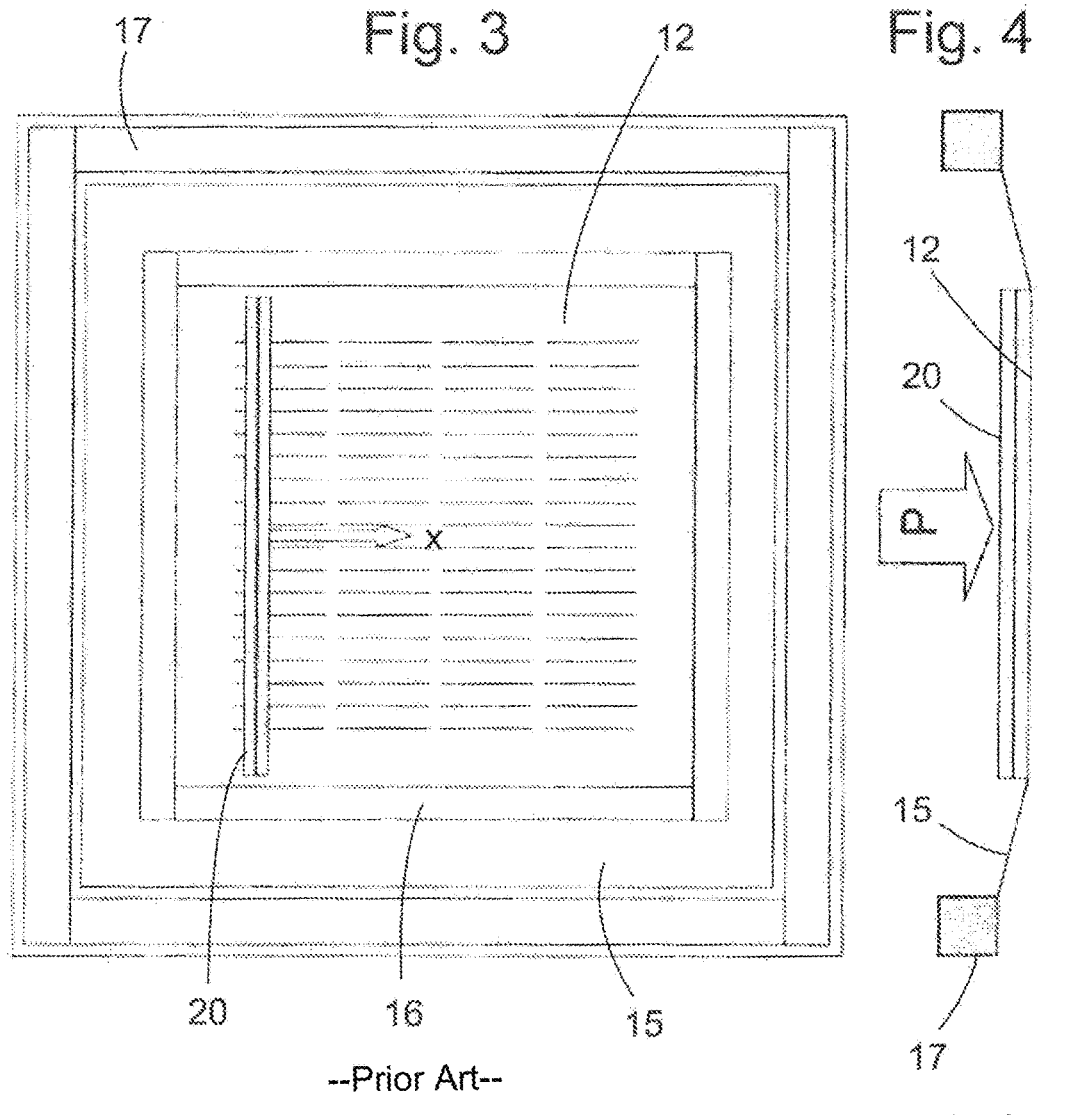
Fig. 3
Fig. 4
--Prior Art--
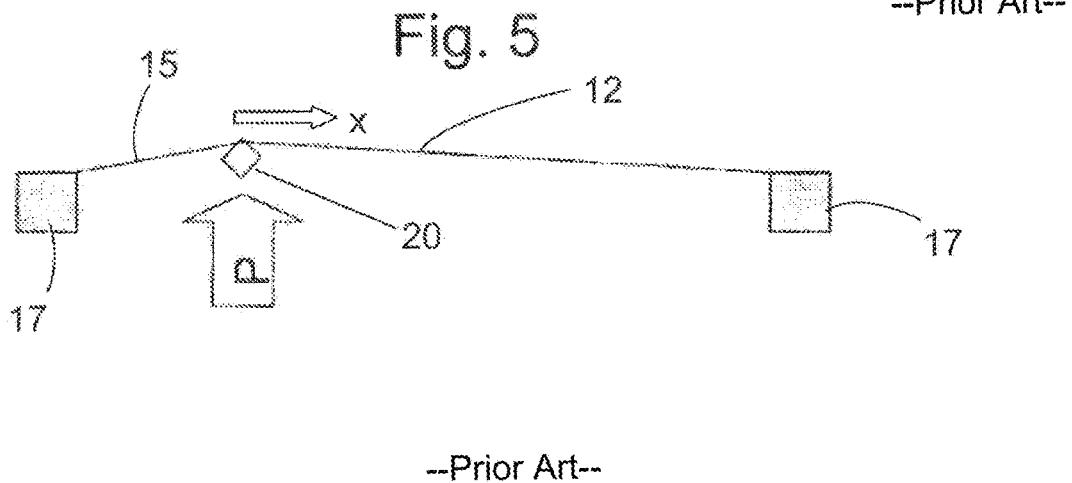
Fig. 5
--Prior Art--

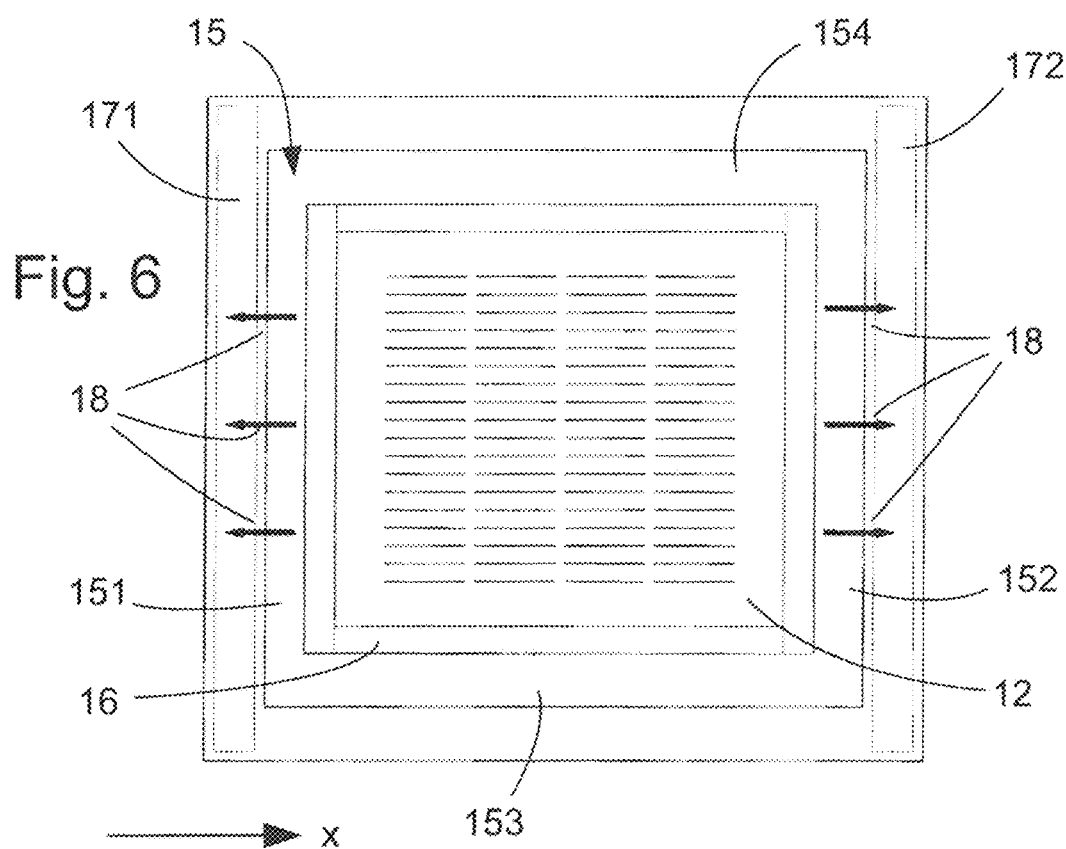
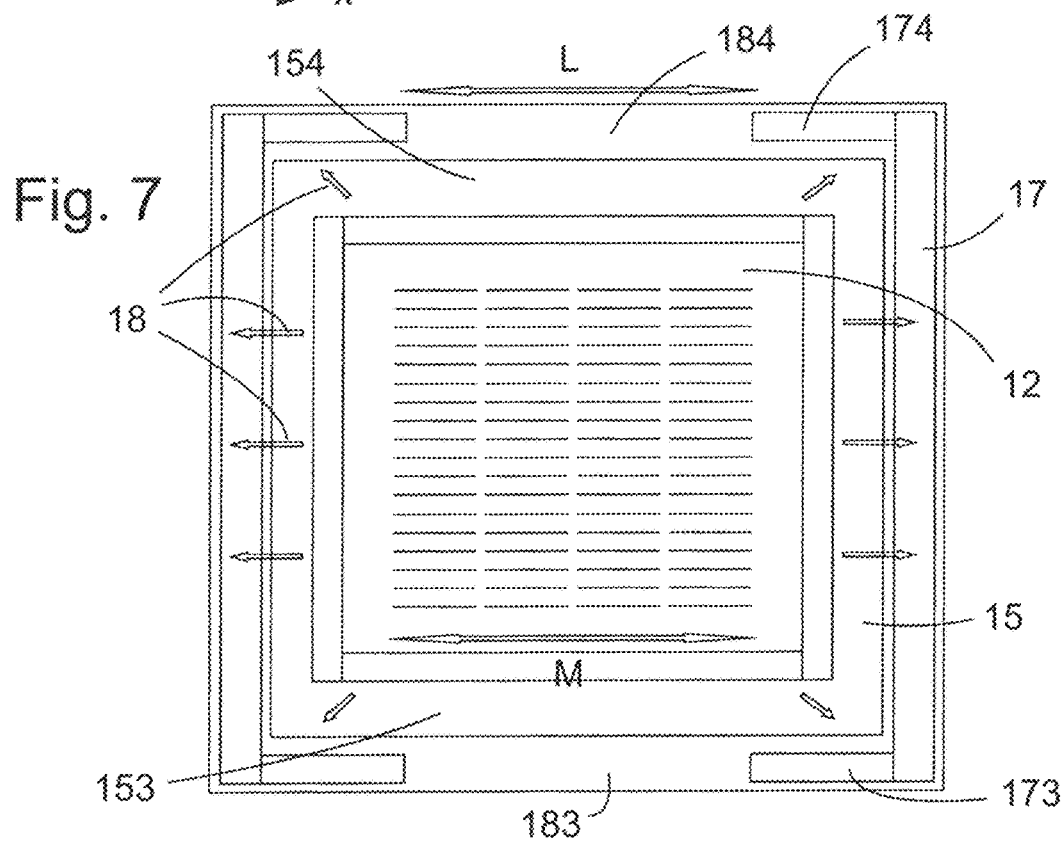

SCREEN-PRINTING SYSTEM FOR A PHOTOVOLTAIC CELL, AND RELATED METHODS

This application is a 371 of PCT/EP2012/062339 filed on Jun. 26, 2012, published on Jan. 10, 2013 under publication number WO 2013/004550, which claims priority benefits from French Patent Application Number 1155923 filed Jul. 1, 2011, the disclosure of which is incorporated herein by reference.

The invention relates to a screen-printing system that is particularly suitable for manufacturing photovoltaic devices and more particularly for printing collecting conductors on a photovoltaic cell. It also relates to a printing process using such a printing system and to a process for manufacturing a photovoltaic cell incorporating such a printing process. The invention also relates to a unit for producing photovoltaic cells implementing such a process. It also relates to a process for manufacturing such a screen-printing system.

A photovoltaic cell is manufactured using a wafer made of a semiconductor, generally silicon. This manufacture in particular requires electrical conductors to be formed on the surface of this wafer. FIG. 1 illustrates the surface of such a wafer 1 according to the prior art, which comprises first parallel conductors of thin width, called collecting conductors 2, the function of which is to collect the electrons created in the silicon by light. In addition, the surface of the wafer 1 comprises other wider parallel conductors 3, sometimes called "bus bars", oriented in a direction perpendicular to the collecting conductors 2, the function of which bus bars is to carry larger currents from photovoltaic cell to photovoltaic cell. These wider conductors 3 are in general connected to a metal strip that extends over their entire length. All of these conductors 2, 3 are obtained by various techniques allowing continuous conductive lines to be formed, which lines extend continuously over the entire length and width of the wafer.

To produce these conductors, one prior-art method consists, for example, in screen-printing a conductive ink on the wafer, in one or two screen-printing steps. To do this, the method consists in making the conductive ink pass through a screen formed from a cloth or fabric. This cloth is covered with a sealing layer except in the locations where the ink must pass through it. The ink is pressed through the cloth using a doctor blade: however, the threads of the cloth hinder this operation, and the resulting conductors never have an ideal geometry, especially as regards the uniformity of the height of the layer of ink deposited: this method does not allow conductors with a sufficiently satisfactory performance to be formed. Specifically, the electrical performance of these conductors is very sensitive to their geometry, and especially to their thickness/width ratio, thickness being measured in the vertical direction perpendicular to the wafer 1, and width being measured in the horizontal direction, transverse to the conductor.

Document U.S. Pat. No. 6,258,445 describes a stencil that is fixed via a portion of its perimeter to a frame. This stencil has a plastic web reinforced with a metal deposit. However, such an approach does not allow a satisfactory result to be obtained.

To overcome these drawbacks, a second prior-art method consists in replacing the above cloth with a metal stencil containing through-apertures. However, in order not to weaken these metal masks, and to obtain optimal behaviour during printing, the area of the apertures, and especially of any apertures that extend over the entire length or width of the stencil, must be limited, and the process generally requires at least two printed layers to be superposed, using two separate complementary masks, to obtain the various conductors illustrated in FIG. 1. For this reason, this process remains complex and expensive. In addition, as the metal stencil does not have the elasticity of a cloth and does not deform sufficiently under the effect of a doctor blade, it is associated with a cloth adhesively bonded to its periphery in order to provide the assembly with sufficient elasticity, this construction being called a "trampoline" assembly.

FIGS. 2 to 5 schematically show such a trampoline construction, applied to a step for screen printing conductors on the surface of a silicon wafer 5 in order to form photovoltaic cells. The printing device comprises a printing table 11 on which the silicon wafer 5 rests, a rectangular metal stencil 12 comprising a central printing zone 13 that comprises apertures through which the conductive ink is intended to pass in order to form the conductors 2, 3 of the future photovoltaic cell, on the surface of the silicon wafer—as was described above and as shown in FIG. 1. To do this, the metal stencil 12 is positioned a distance of about 1 mm above the silicon wafer 5 to be printed, and a doctor blade 20 that extends over the entire width of the silicon wafer 5 is moved in translation, in a direction X, over the entire length of the silicon wafer 5, thereby transmitting a pushing force P comprised between 30 N and 150 N to the surface of the metal stencil 12 in order to deform it and press the ink through its apertures onto the surface of the silicon wafer 5. In order to be able to withstand this stress and achieve sufficient deformation, and in order to allow the stencil to unstick after the doctor blade has passed, the metal stencil 12 is fixed to a cloth 15 in a bonding zone 16 extending over the four sides of its rectangular periphery. Lastly, the four sides forming the rectangular edge of this cloth 15 are themselves adhesively bonded to a rectangular frame 17.

Nonetheless, this printing method has the following drawbacks:

the cloth exerts a stress on the metal stencil which causes it to deform around its apertures, especially those located near the edges. This results in the features printed being larger than desired, leading to aspect defects and thereby decreasing the performance of the photovoltaic cell; and in addition, this stress exerted on the cloth may even induce a more substantial overall deformation of the metal stencil, which is in general very thin, for example bending lines that are intended to be rectilinear. The conductors are therefore deformed. In addition, deformation increases during implementation of the printing system and more particularly during the passage of the doctor blade. Thus, it is very difficult to precisely superpose an ink layer on localized zones, whether this ink layer is a second layer of conductive ink deposited on a first layer (double printing technology), or an ink layer deposited on an overdoped zone (selective emitter technology), thereby degrading the performance of the photovoltaic cell.

These drawbacks may be mitigated by using larger frames, for example 15-inch frames instead of 12-inch frames for the screen printing of 6-inch cells, but this leads to a notable increase in cost.

Thus, a general objective of the invention is to provide a solution for producing an electrical conductor on a wafer of a photovoltaic device, which solution mitigates the drawbacks of prior-art solutions.

More precisely, the invention seeks to achieve all or some of the following objectives:

A first objective of the invention is to provide a solution for producing an electrical conductor on a photovoltaic cell allowing the performance of the resulting photovoltaic cell to be optimized.

A second objective of the invention is to provide a solution for producing an electrical conductor on a photovoltaic cell, via a process that is effective and economical and has a high productivity.

For this purpose, the invention relates to a screen-printing system comprising a metal stencil, characterized in that a cloth fixed to the metal stencil has at least one free end, in order to decrease or prevent its deformation under the effect of a doctor blade. A portion of the peripheral edge of the cloth may be left free.

The invention also relates to a unit for manufacturing photovoltaic devices, characterized in that it comprises a screen-printing system such as described above.

The invention also relates to a screen-printing process using a screen-printing system such as described above, characterized in that it comprises a step of doctoring the stencil causing a free end of a cloth fixed to the metal stencil to move.

The process for manufacturing a photovoltaic device may comprise a step of screen printing conductors on a silicon wafer using a screen-printing system such as described above.

The invention is more precisely defined by the claims.

These subjects, features and advantages of the present invention will be described in detail in the following description of particular embodiments given by way of nonlimiting example and with reference to the appended figures, in which:

FIG. 1 schematically illustrates conductors on the surface of a photovoltaic cell according to the prior art.

FIG. 2 schematically shows a cross-sectional view of a screen-printing system with a trampoline construction for printing conductors on the surface of a photovoltaic cell according to the prior art.

FIG. 3 schematically shows a top view of the trampoline-construction screen-printing system according to the prior art.

FIG. 4 schematically shows a cross-sectional view perpendicular to the axis X of the trampoline-construction screen-printing system according to the prior art.

FIG. 5 schematically shows a cross-sectional view parallel to the axis X of the trampoline-construction screen-printing system according to the prior art.

FIG. 6 shows a top view of a portion of a screen-printing system according to one embodiment of the invention.

FIGS. 7 to 9 show top views of a portion of a screen-printing system according to variant embodiments of the invention.

In the following description, for the sake of simplicity, the same references will be used in the various figures to designate similar elements, even though the latter may be different shapes and/or have different properties.

Figure 1:
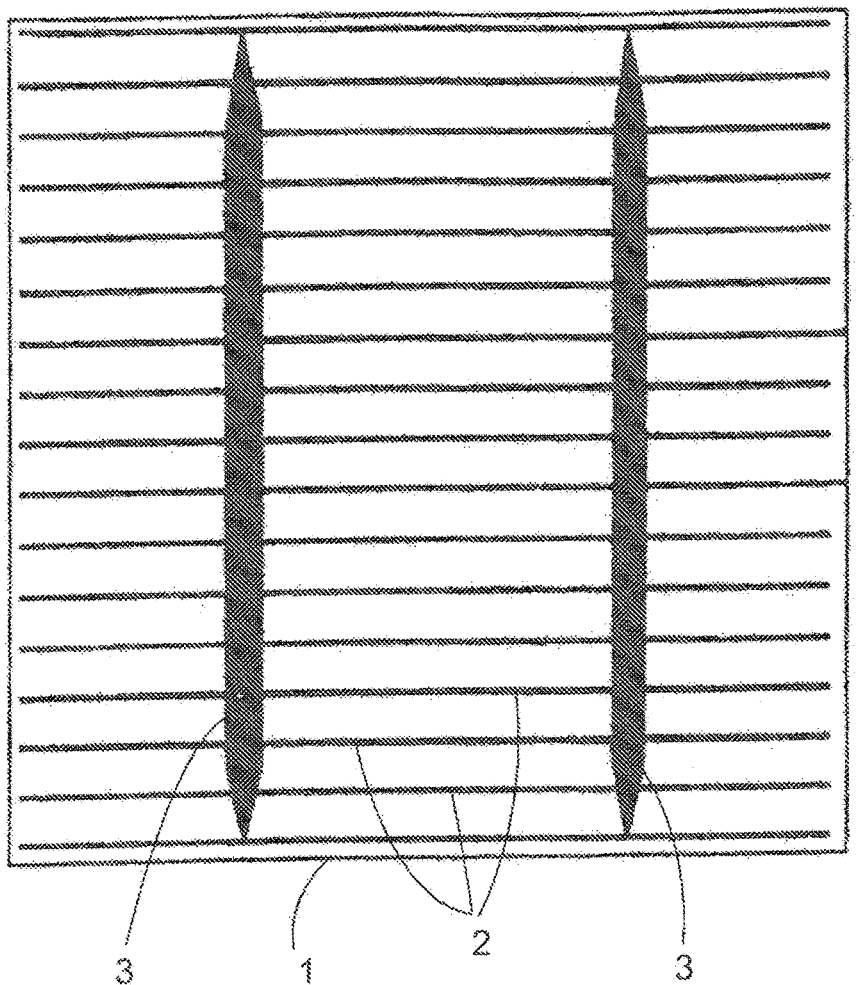
Figure 2:
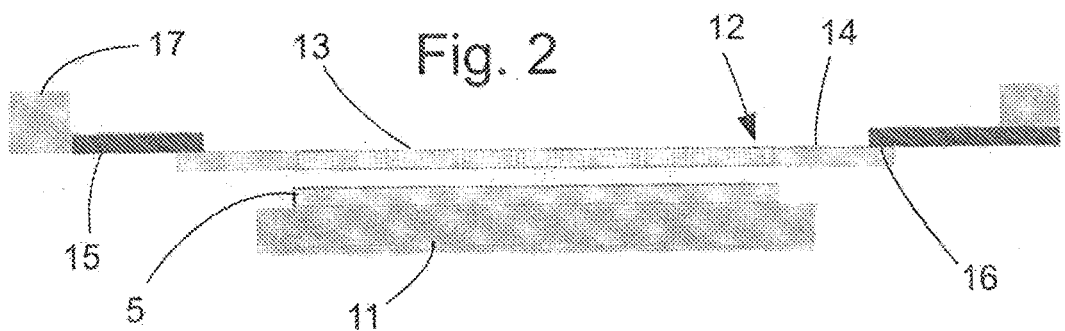

FIG. 6 shows an embodiment of the invention, in which the screen-printing system is also based on a trampoline construction. Thus, it comprises a rectangular metal stencil 12 fixed to a cloth 15, in an edge zone 16 extending over the four sides of its rectangular periphery, by adhesive bonding or any fixing device. However, this cloth 15 is no longer fixed to a frame over its entire external periphery. Specifically, only two sides 151, 152 of this cloth, which sides are positioned in the direction perpendicular to the movement direction X of a doctor blade, are fixed to two sides 171, 172, respectively, of a supporting frame 17 by any sort of fixing device 18, such as adhesive bonding. In contrast, the lateral portions 153, 154 of the cloth have free ends that are not fixed to a frame. This embodiment has the advantage of stopping the metal stencil 12 from stretching in the lateral direction under the effect of the pressure of a doctor blade, thereby preventing printing defects caused by this effect.

In this solution, the cloth 15 is therefore fixed to the entire periphery of the metal stencil, in order to form a trampoline assembly such as described above. This assembly has a portion of its peripheral edge left free, thereby decreasing or preventing deformation of the metal stencil during the manufacture of the printing system and during its operation under the effect of a doctor blade. The cloth 16 holds the metal stencil tight in the supporting frame. With the adopted geometry, the reduction or prevention of deformation of the metal stencil is in particular obtained in the movement direction of the doctor blade.

The peripheral cloth 15 advantageously consists of woven threads, possibly metal threads but preferably organic threads (polyester, polyamide, and/or polyacrylate threads) in order to limit cost, and preferably polyester threads for greater flexibility.

Figure 8:
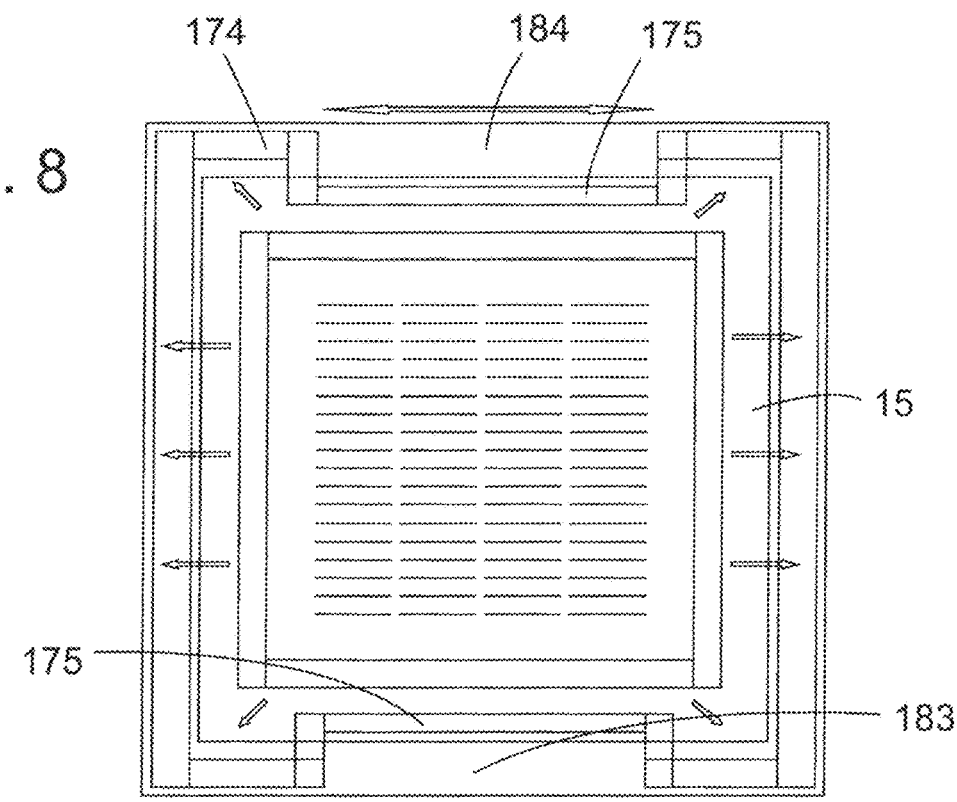
Figure 9:
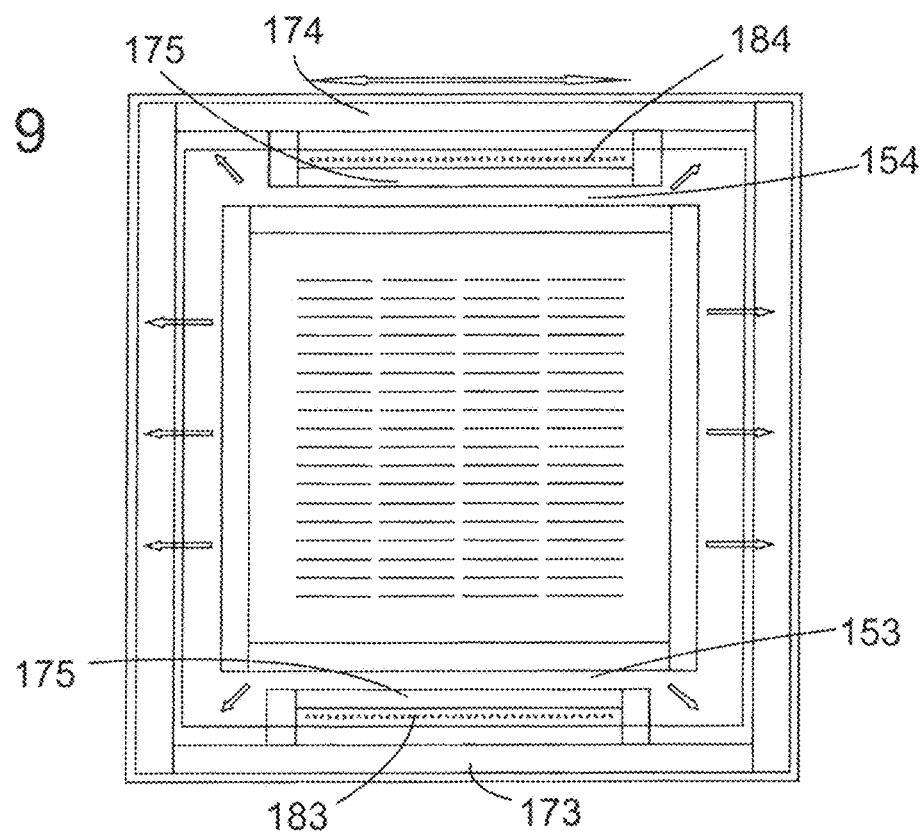

FIGS. 7 to 9 illustrate a number of variant embodiments in which the cloth 15 is fixed to a frame 17 over its entire peripheral edge except for in two zones in opposite lateral portions 153, 154 of the cloth that define apertures 183, 184, respectively, between the cloth 15 and the frame 17, and more precisely between the lateral portions 153, 154 of the cloth and the facing sides 173, 174 of the frame 17. As a variant, these apertures 183, 184 are simply obtained by leaving the ends of the cloth 15 free, the frame being absent.

In these variant embodiments, the apertures 183, 184 have a rectilinear shape and lie substantially parallel to external arms 173, 174 of the frame 17, and substantially in the extension of the pattern to be printed such as defined by through-apertures in the metal stencil 12, the apertures 183, 184 furthermore being centred with respect to these through-apertures. They do not extend over the entire length of the cloth but over a length L substantially equal to the length M of the pattern to be printed, defined by the metal stencil 12, this length M being measured in the direction substantially parallel to the arms 173, 174 of the frame 17 and/or to the sides 153, 154 of the cloth. As a variant, the apertures have a different length L, preferably comprised between M−30 mm and M+80 mm (L and M being expressed in mm). Advantageously, these apertures have a length L slightly larger than the size M of the pattern to be printed, ideally about M+25 mm (for example, those lateral portions 153, 154 of the cloth which have free ends not fixed to a frame will be 170 mm in length for metallizations of 153 mm printed, in an example embodiment of a printed pattern of typical length, on a 156 mm wafer, i.e. a 6-inch wafer). This length L, which is preferably smaller than that of the cloth, i.e. than the total length of one side 153, 154 of the cloth 15, makes it possible to guarantee a slight lateral tension in the metal stencil at its ends.

Specifically, it is advantageous to maintain a minimum lateral tension in order for the metal stencil to remain taut in both directions. This is why it is desirable for a portion of the lateral tension transmitted by the cloth to remain at the ends. However, it is necessary for there not to be any lateral tension in the portion of the stencil corresponding to the printing zone, in order to prevent deformation of the latter. Thus, those lateral portions 153, 154 of the cloth which have free ends not fixed to a frame, for example via apertures as explained above, are arranged level with this printing zone of the stencil, and dimensioned depending on the size of the through-apertures in the stencil, which through-apertures define a pattern to be printed.

The apertures 183, 184 may be obtained by various processes, for example by an absence of adhesive bonding of the cloth to the frame, or via a traditional adhesive bonding followed by cutting of the cloth. In addition, according to another variant embodiment, these apertures are not straight, in contrast to the preceding example, but may have curved shapes.

FIGS. 8 and 9 illustrate two variants in which the frame 17 has a portion 175 level with the apertures 183, 184 between the cloth and the frame, which fulfils the function of reducing the risk of the ends of the cloth 15 running level with these apertures. This portion 175 may be obtained by any adhesive type deposition on the free end of the cloth 15. Specifically, it is desirable to prevent the cloth from running from the zone not fixed, for example not adhesively bonded, to the frame, i.e. to prevent threads from detaching at the free ends of the lateral portions 153, 154 of the cloth. The free zone of this cloth may advantageously be stabilized using, for example, the same adhesive bonding material used to adhesively bond the frame/cloth or metal stencil and cloth), the deposition of this adhesive however being shifted towards the interior in order for it not to make contact with the frame in the zone to be left free, as is illustrated by the portions 175 in FIG. 8. As a variant, shown in FIG. 9, the cloth 15 could first be bonded to the frame 17 on the four sides then cut in a zone inside the frame, an additional bead of adhesive being added to the cloth towards the interior, thus surrounding the cloth portion to be cut in order to prevent running level with the apertures 183, 184 finally obtained.

As a variant (not shown) the screen-printing system comprises a rectangular metal stencil fixed to a cloth in a smaller zone that no longer extends over the four sides of its rectangular periphery. Specifically, only two sides of this stencil, which sides are positioned in a direction perpendicular to the movement direction X of a doctor blade, are fixed to two sides, respectively, of a peripheral cloth by a fixing device such as adhesive bonding, respectively. In contrast, lateral portions of the metal stencil remain free and are not fixed to the cloth or to the frame. The cloth remains fastened to the frame over its entire periphery, on its four sides.

The invention was described by way of particular embodiments given by way of example. It is more generally applicable to any screen-printing system comprising a metal stencil characterized in that a cloth fixed to the metal stencil has at least one free end in order to reduce or prevent its deformation under the effect of a doctor blade. Thus, the stencil and the cloth may have other shapes and sizes than those described above, have free ends that are different from those described, for example extending over a smaller or larger length, and/or have a different number of free ends.

Finally, the invention therefore also relates to a process for manufacturing a screen-printing system, characterized in that it comprises fixing a cloth fixed to the metal stencil such that it is left with at least one free end, in order to decrease or prevent its deformation under the effect of doctor blade.

The invention also relates to a process for producing an electrical conductor on a wafer using a printing system such as described above, characterized in that it comprises a step of printing through the stencil in order to deposit a layer of conductive ink on the surface of the wafer, in order to form a number of conductors, a doctor blade being used to press this ink through the apertures in the central part of the stencil, and thereby causing a free end of a cloth fixed to the metal stencil to move.

This printing process is particularly advantageous when employed in a process for manufacturing a photovoltaic device to form all or some of its surface conductors, such as the collecting conductors and/or the bus bar conductors.

In particular, the printing may allow first conductors to be formed in a first direction, these conductors being discontinuous and interrupted in at least one interconnecting zone, before an electrical connection is produced by covering the interconnecting zones of the first conductors with at least one second conductor. This last step is advantageously obtained by fastening a metal strip by soldering or adhesive bonding.

The invention also relates to a unit for manufacturing photovoltaic devices, characterized in that it comprises a screen-printing system such as described above for implementing this conductor printing process.

The invention claimed is:
1. A screen-printing system comprising:
a trampoline assembly including a support frame, a metal stencil, and a cloth, wherein the entire external periphery of said metal stencil is fixed to the cloth, while the external periphery of the cloth is selectively fixed to the support frame; and
a doctor blade moving in a movement direction over the metal stencil,
wherein the external periphery of the cloth has at least one free end that is not fixed to the support frame in order to decrease or prevent deformation under the effect of the doctor blade,
wherein the at least one free end is not fixed to the metal stencil, and
wherein the at least one free end of the cloth is oriented in a direction that is parallel to the movement direction of the doctor blade.
2. The screen-printing system according to claim 1, wherein a portion of a peripheral edge of the cloth is left free by way of at least one aperture produced at its edge.
3. The screen-printing according to claim 1, wherein the cloth comprises woven threads comprising:
metal threads, and/or
organic threads, the organic threads including:
polyester, polyamide and/or polyacrylate threads.
4. The screen-printing according to claim 1, wherein the cloth has two parallel, opposite sides located beyond the external periphery of the metal stencil, said two parallel opposite sides oriented in the direction perpendicular to the movement direction of the doctor blade of the printing system, and
wherein said two parallel, opposite sides are fixed over their entire length to the supporting frame.
5. The screen-printing according to claim 1, wherein a length L of the at least one free end is smaller than the length of a side of the cloth in order to maintain a tension exerted in two directions.
6. The screen-printing according to claim 1, wherein the metal stencil comprises through-apertures defining a pattern to be printed of length M (in mm) measured in the direction of the at least one free end of the cloth, the at least one free end having a length L (in mm) between M−30 mm and M+80 mm.

7. The screen-printing according to claim 6,
wherein the at least one free end of the cloth is substantially centered with respect to the pattern to be printed, said pattern defined by the through-apertures in the metal stencil.

8. The screen-printing according to claim 1,
wherein the metal stencil comprises through-apertures defining a pattern to be printed of length M measured in the direction of the at least one free end of the cloth, the at least one free end having a length L larger than the length M of said pattern.

9. The screen-printing according to claim 1, further comprising:
an adhesive type deposit on at least a portion of the at least one free end of the cloth to prevent the cloth from running.

10. The screen-printing according to claim 1,
wherein the screen-printing system is part of a unit for printing conductors on a photovoltaic device.

11. A unit for manufacturing photovoltaic devices,
wherein the unit for manufacturing photovoltaic devices comprises a screen-printing system according to claim 1.

12. Screen-printing process using a screen-printing system according to claim 1, wherein the process comprises:
a step of doctoring the stencil, which causing a free end of the cloth fixed to the metal stencil to move.

13. Process for manufacturing a photovoltaic device, wherein the process comprises:
a step of screen printing conductors on a silicon wafer using a screen-printing system according to claim 1.

14. Process for manufacturing a screen-printing system according to claim 1, wherein the process comprises:
fixing the cloth to the metal stencil, in order to decrease or prevent its deformation under the effect of the doctor blade.

15. A screen-printing system comprising:
a trampoline assembly including a support frame, a metal stencil, and a cloth having an internal periphery and an external periphery, wherein the entire external periphery of said metal stencil is fixed to the entire internal periphery of the cloth, while the external periphery of the cloth is selectively fixed to the support frame; and
a doctor blade moving in a movement direction over the metal stencil,
wherein the external periphery of the cloth has at least one free end that is not fixed to the support frame in order to decrease or prevent deformation under the effect of the doctor blade, and
wherein the at least one free end of the cloth is oriented in a direction that is parallel to the movement direction of the doctor blade.

\* \* \* \* \*